United States Patent [19]
Priel

[11] 3,792,292
[45] Feb. 12, 1974

[54] THREE-STATE LOGIC CIRCUIT

[75] Inventor: Ury Priel, Cupertino, Calif.

[73] Assignee: National Semiconductor Corporation, Santa Clara, Calif.

[22] Filed: June 16, 1972

[21] Appl. No.: 263,680

Related U.S. Application Data

[63] Continuation of Ser. No. 108,359, Jan. 21, 1971, abandoned.

[52] U.S. Cl. ................. 307/209, 307/217, 307/218, 307/299 A, 328/99

[51] Int. Cl.. H03k 19/08, H03k 19/28, H03k 19/38

[58] Field of Search ... 307/209, 214, 215, 216, 217, 307/218, 241, 242, 243, 254, 299 A; 328/92, 93, 94, 95, 96, 97, 104, 154; 330/30 R, 15

[56] References Cited

UNITED STATES PATENTS

| | | | |
|---|---|---|---|
| 3,602,733 | 8/1971 | Aoki | 307/209 |
| 3,229,119 | 1/1966 | Bohn et al. | 307/299 A |
| 3,217,181 | 11/1965 | Zuk | 307/299 A |
| 3,558,931 | 1/1971 | Chernoske | 307/215 X |
| 3,560,761 | 2/1971 | Kardash | 307/215 |
| 3,564,281 | 2/1971 | Tokunaga et al. | 307/214 |
| 3,591,856 | 7/1971 | Kalb | 307/215 X |
| 3,602,735 | 8/1971 | Lodi | 307/214 |
| 3,619,645 | 11/1971 | Chernoske | 307/215 X |
| 3,631,269 | 12/1971 | Monahan | 307/218 X |
| 3,660,675 | 5/1972 | Andrews, Jr. | 307/215 X |

OTHER PUBLICATIONS

"Sylvania Universal High–Level Logic", Sylvania Integrated Circuits, p. 1, 2, 4 & 5, 1965.

*Primary Examiner*—John W. Huckert
*Assistant Examiner*—L. N. Anagnos

[57] ABSTRACT

An improved three-state logic circuit for selectively providing active sourcing, active sinking or high impedance isolation of the circuit output terminal so as to develop "true" output, "false" output or third state, high impedance output signals. A first $T^2L$ data input circuit selectively drives, through a buffer stage, an active pull-up circuit and an active pull-down circuit in response to logic input signals, and a second $T^2L$ output disable circuit cooperates with the buffer stage to selectively disable the active pull-up and pull-down circuits in response to a disable signal.

10 Claims, 5 Drawing Figures

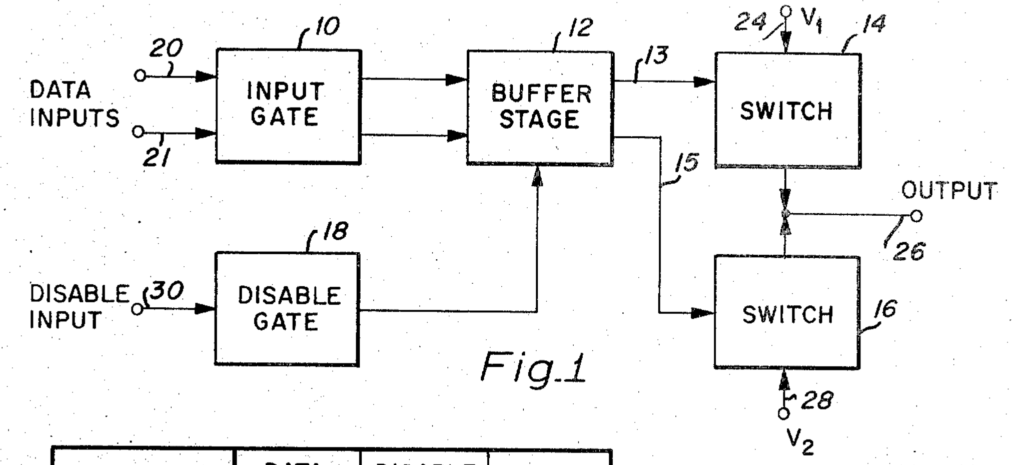
Fig.1
| | DATA INPUTS | | DISABLE INPUT | OUTPUT |
|---|---|---|---|---|
| TERMINALS | 20 | 21 | 30 | 26 |
| LOGIC | 0 | 0 | 0 | 0 |
| | 0 | 1 | 0 | 0 |
| | 1 | 0 | 0 | 0 |
| | 1 | 1 | 0 | 1 |
| | 0 | 1 | 1 | Z |
| | 1 | 0 | 1 | Z |
Fig.2
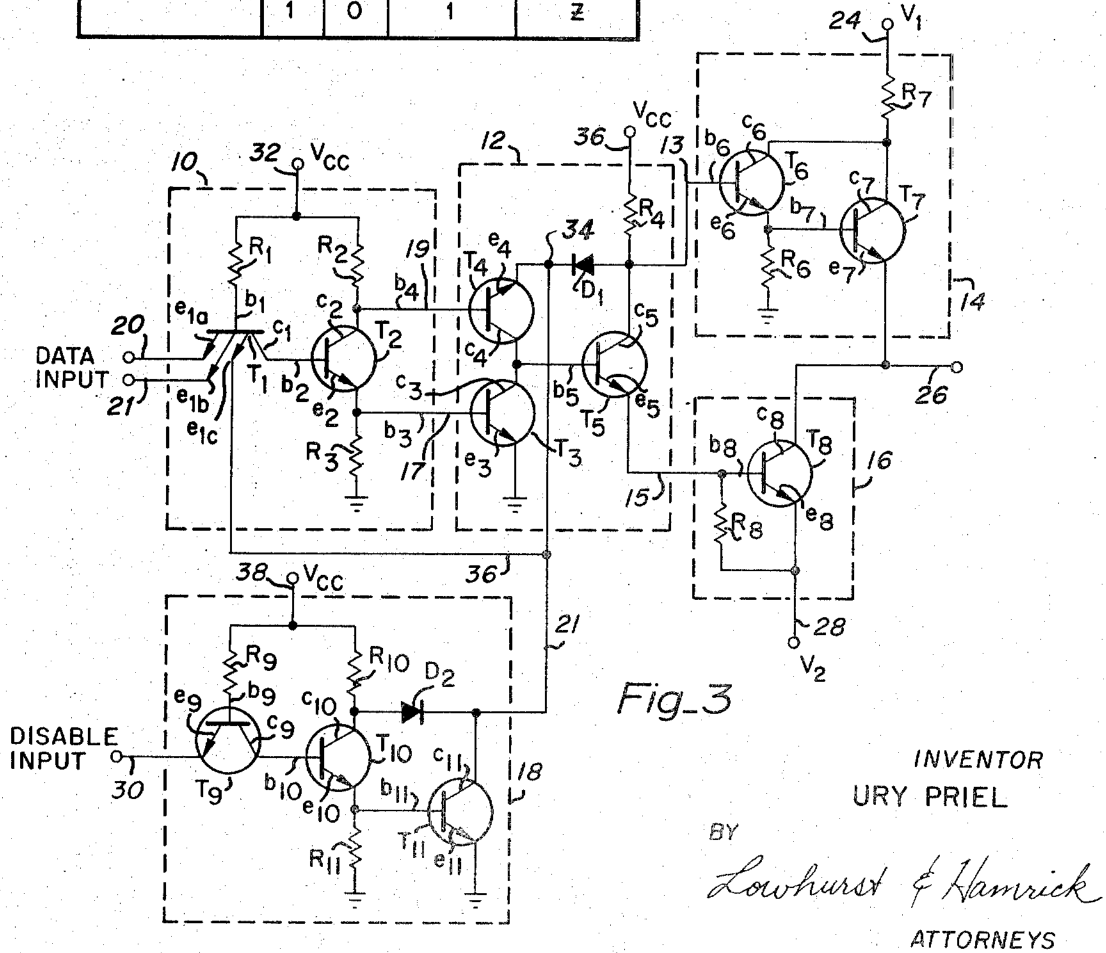
Fig.3
INVENTOR
URY PRIEL
BY
Lowhurst & Hamrick
ATTORNEYS INVENTOR
URY PRIEL
BY
Lowhurst & Hamrick
ATTORNEYS

THREE-STATE LOGIC CIRCUIT

RELATED CASES

The present application is a continuation application of copending U.S. patent application Ser. No. 108,359 filed Jan. 21, 1971, and now abandoned, and assigned to the same assignee as the present invention.

BACKGROUND OF THE INVENTION

1. Field of the Invention

The present invention relates generally to logic circuitry and particularly to a novel three-state logic circuit having improved logic capability operational speed, and more efficient component utilization.

2. Description of the Prior Art

In contemporary logic systems, such as those employed in the minicomputers that have become popular as of late, it is extremely convenient if the output terminals of a large number of logic circuits can be simply hard-wired to a single bus-type output line leading to a particular circuit junction. This not only reduces the number of logic elements required in a given circuit, but also reduces the physical space necessary to accommodate the system. However, one of the problems in connecting a plurality of logic circuits to a single bus line is that intermediate external buffer gates are usually required to selectively isolate each logic circuit from the bus line so as to prevent unwanted interaction between the various circuits. Prior art bus-connected logic circuits typically provide active pull-down but passive pull-up of the data bus, thus limiting the speed at which data can be transmitted through the system because of the RC time delays associated with the passive pull-up mode of operation. For example, whereas the active pull-down capability of the circuit provides rapid response in pulling down the bus line potential, the passive pull-up time is severely limited by the inherent capacitances associated with the bus line and the current limiting pull-up resistance.

A new three-state logic technique has been recently developed wherein the bus line may be made "floating with respect to both the source and sink potentials, and both sourcing and sinking of the bus line are actively accomplished so that a third, high impedance logic state, which is intermediate between the source and sink potentials, is achieved. This new technique is disclosed in the copending U.S. patent application of Dale A. Mrazek, Ser. No. 93,224, filed Nov. 27, 1970 and assigned to the assignee of the present invention. The disclosure made in the above identified application is expressly incorporated into the present application by reference.

SUMMARY OF THE PRESENT INVENTION

In accordance with the present invention, an improved three-state logic circuit is provided which enables the circuit output terminal to be actively sourced, actively sinked or be put in a third, high impedance isolation state. In response to a true input or a false input applied to one set of input terminals and a disable input applied to another set of input terminals, output signals can be obtained at a single set of output terminals having three states, namely, true ("1"), false ("0"), or high impedance (3), respectively. The preferred embodiment includes a first $T^2L$ input circuit for selectively driving an active pull-up switching circuit and an active pull-down switching circuit, an internal buffer stage for normally coupling the outputs of the first $T^2L$ input circuit to the active pull-up and pull-down circuits, and a second $T^2L$ disable circuit which cooperates with the buffer to disable the active pull-up and pull-down switching circuits.

Among the advantages of the present invention are that because of the active sinking and sourcing of the output terminal, the speed of operation of the circuit is made considerably faster than in other prior art bus-connected logic circuits. Furthermore, because of the low leakage provided in the sourcing and sinking gates an unusually large number of such circuits can be tied to a single output bus line.

It is therefore a primary object of the present invention to provide an improved three-state logic circuit having true, false, and high impedance logic states.

Another bject of the present invention is to provide an improved three-state logic circuit having both active pull-up and active pull-down capability so as to improve the operational speed of a logic system including such circuitry.

Still another object of the present invention is to provide an improved three-state logic circuit having active pull-up and active pull-down capability as well as an intermediate high output impedance capability.

Other objects and advantages of the present invention will no doubt become apparent to those skilled in the art after having read the following detailed description of the preferred embodiments which makes reference to the several figures of the drawing.

IN THE DRAWING

FIG. 1 is a simplified block diagram functionally illustrating the operation of the present invention.

FIG. 2 is a truth table indicating the state of the output signals developed by the present invention in response to the various combinations of data input and disable input signals.

FIG. 3 is a schematic diagram of a preferred integrated circuit embodiment of a three-state logic circuit in accordance with the present invention.

DETAILED DESCRIPTION OF THE PREFERRED EMBODIMENTS

Figure 4:
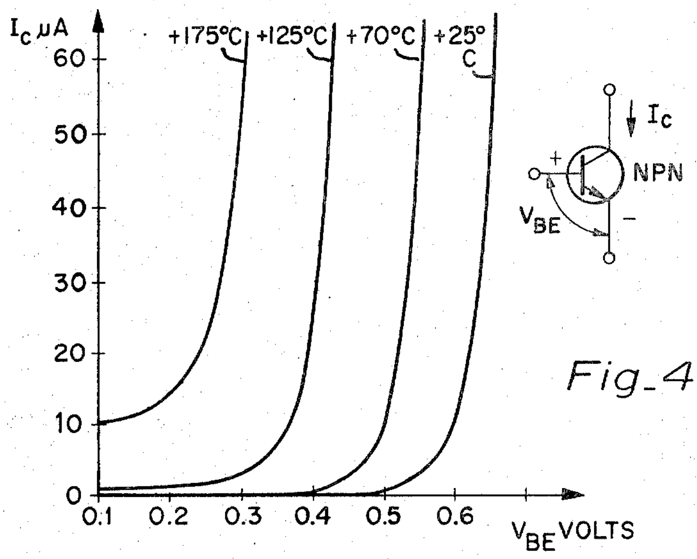
FIG. 4 is a diagram illustrating the change in transistor transfer characteristics with temperature.
Figure 5:
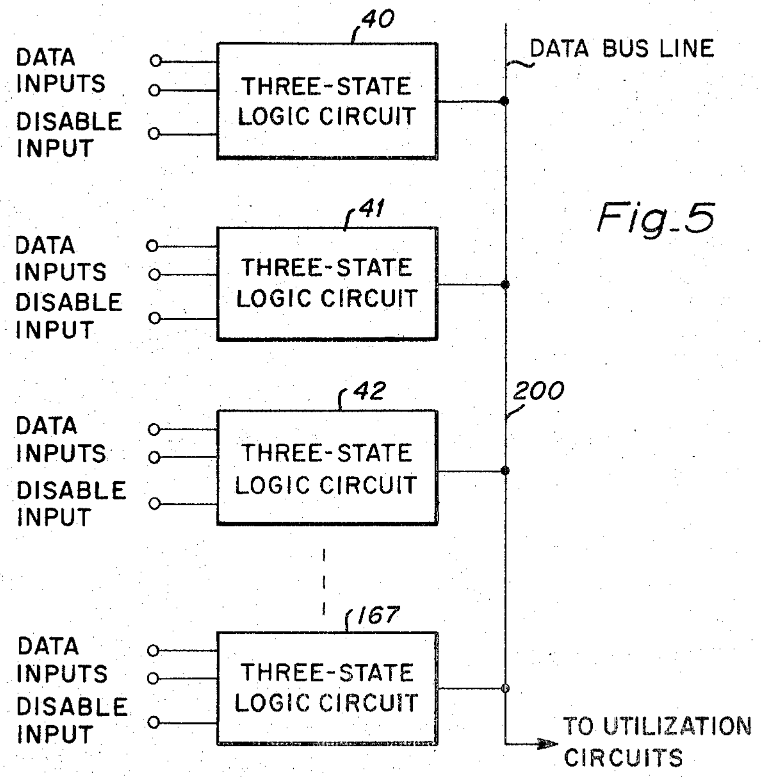
FIG. 5 is a block diagram showing a plurality of logic circuits in accordance with the present invention coupled to a single data bus lines.

Referring now to FIG. 1 of the drawing, the invention is shown in terms of a functional block diagram which includes an input gate 10, a buffer stage 12, a sourcing switch 14, a sinking switch 16 and a disable gate 18. With a "low", or logic 0, disable signal applied to disable input terminal 30, input gate 10, in response to input signals applied to input terminals 20 and 21, develops an output signal which is fed through buffer gate 12 to actuate either switch 14 or switch 16 depending upon the logic states of the input signals as shown in the truth table of FIG. 2. For example, if a logic 1 is applied to input terminal 20 (while a logic 0 is applied to input terminal 21), buffer stage 12 will develop signals on lines 13 and 15 causing switch 16 to be turned ON coupling source $V_2$, applied at terminal 28, to output terminal 26, and switch 14 to be turned OFF isolating output terminals 26 from the source potential $V_1$ which is applied at terminal 24. If thereafter a logic 1 is applied to input terminal 21 (while a logic 1 is applied to terminal 20), buffer stage 12 will develop signals on lines 13 and 15 causing switch 14 to be turned ON and switch 16 to be turned OFF coupling output terminals 26 to the source potential $V_1$.

Buffer stage 12 is, as will be explained below in more detail, additionally responsive to the output of disable gate 18 and is operative to disable the switches 14 and 16 so that they will open and remain open independent of any input signal applied to input terminals 20 and 21 and output terminal 26 will be held in a high impedance third state (Z in FIG. 2). In other words, in response to a "high", or logic 1, applied to disable input terminal 30, buffer stage 12 will be disabled so that switches 14 and 16 are completely non-responsive to the input signal applied to data input terminal 20 and present a high impedance to current flow from $V_1$ to output terminal 26 and from output terminal 26 to $V_2$. On the other hand, the application of a logic 0 to disable input terminal 30 will allow buffer stage 12 to actuate switches 14 and 16 in accordance with the input signals applied to terminal 20 and 21.

In FIG. 3 of the drawing, a schematic diagram of a preferred embodiment of the invention suitable for integrated circuit applications is illustrated wherein like numbers refer to parts corresponding to those shown in FIG. 1. Although input gate 10 is essentially a NAND circuit and can take any of several configurations, the preferred embodiments illustrated in FIG. 2 includes a $T^2L$ circuit comprising an NPN multiple emitter transistor (MET) $T_1$ and an NPN transistor $T_2$. Base $b_1$ of transistor $T_1$ is coupled through a resistor $R_1$ to a voltage source $V_{cc}$ at terminal 32. Emitter $e_{1a}$ is coupled to data input terminal 20, $e_1$b is coupled to data input terminal 21, and collector $c_1$ is direct coupled to base $b_2$ of transistor $T_2$. Collector $c_2$ of transistor $T_2$ is coupled through a resistor $R_2$ to $V_{cc}$ at terminal 32 and emitter $e_2$ is coupled to circuit ground through a resistor $R_3$.

When input terminals 20 and 21 are high, MET $T_1$ is normally non-conductive and collector $c_1$ rises in potential toward $V_{cc}$ thereby saturating transistor $T_2$ and turning it ON. Accordingly, line 17 will rise in potential. Note collector $c_2$ (line 19) is also at about the same potential as emitter $e_2$. However, when either emitter $e_{1a}$ or $e_{1b}$ is pulled low, MET $T_1$ saturates and removes current from base $b_2$ turning transistor $T_2$ OFF thereby causing line 17 to return to a low potential.

Buffer stage 12 includes three NPN transistors $T_3$, $T_4$ and $T_5$ and a diode $D_1$. The base $b_3$ of transistor $T_3$ is coupled to line 17 while emitter $e_3$ is connected to circuit ground and collector $c_3$ is connected to collector $c_4$ of transistor $T_4$. Base $b_4$ is connected to collector $c_2$ and emitter $e_4$ is connected to the cathode of diode $D_1$ at circuit node 34. Base $b_5$ of transistor $T_5$ is coupled to collectors $c_3$ and $c_4$ and collector $c_5$ is coupled to the anode of diode $D_1$ and through a resistor $R_4$ to $V_{cc}$ at terminal 36. With line 17 high, transistor $T_3$ conducts pulling collector $c_3$ to within one $V_{ce(sat)}$ of ground thus turning OFF transistor $T_5$. With transistor $T_5$ OFF, essentially no current flows in its emitter circuit and thus line 15 is low. However, with no current flowing through $T_5$, collector $c_5$ and thus line 13 are high (appox. $V_{cc}$). With line 17 low transistor $T_3$ is pulled out of saturation and into its OFF state allowing its collector $c_3$ to be pulled up through the base-collector junction of transistor $T_4$ to approximately two diode drops above $V_2$ (circuit ground). Base $b_5$ of transistor $T_5$ is likewise pulled up driving $T_5$ into saturation. As current flows through transistor $T_5$ and out of its emitter $e_5$ line 15 is pulled up. However, line 13 is pulled down below $V_{cc}$ by an amount equal to the voltage drop across resistor $R_4$.

Sourcing switch 14 includes a Darlington connected pair of transistors $T_6$ and $T_7$ with the base $b_6$ of transistor $T_6$ coupled to line 13, emitter $e_6$ coupled to base $b_7$ of transistor $T_7$ and to circuit ground through a biasing resistor $R_6$. Collectors $c_6$ and $c_7$ are coupled through a load resistor $R_7$ to the source $V_1$ at terminal 24. Emitter $e_7$ is connected directly to output terminal 26. With base $b_6$ at $V_{cc}$, transistor $T_6$ is saturated causing $T_7$ to couple output terminal 26 to source $V_1$ through resistor $R_7$. However, when transistor $T_5$ is biased into saturation, the voltage drop across resistor $R_4$ is sufficient to render the Darlington pair ($T_6$ and $T_7$) non-conductive, thus isolating output terminal 26 from source $V_1$.

Sinking switch 16 includes a single NPN transistor $T_8$ having its base $b_8$ coupled to line 15, its collector $c_8$ coupled to output terminal 26 and its emitter $e_8$ coupled to sink potential source $V_2$ at terminal 28. A turn-off resistor $R_8$ is connected between base $b_8$ and emitter $e_8$. When transistor $T_5$ is conductive, current flowing into base $b_8$ causes transistor $T_8$ to saturate and connect output terminal 26 to the sink potential $V_2$. On the other hand, when transistor $T_5$ is unsaturated, transistor $T_8$ is OFF and thus isolates terminal 26 from sink potential $V_2$. Although the source potential $V_1$ may be of any suitable potential, it is typically common with $V_{cc}$. Similarly, sinking potential $V_2$ may be any suitable potential, but is typically common with circuit ground.

Disable gate 18 includes a $T^2L$ circuit comprised of the transistors $T_9$ and $T_{10}$, a switching transistor $T_{11}$ and a diode $D_2$. Emitter $e_9$ is connected to disable input terminal 30 while collector $c_9$ is direct coupled to base $b_{10}$ of transistor $T_{10}$. Base $b_9$ is coupled through a resistor $R_q$ to $V_{cc}$ at terminal 38 and collector $c_{10}$ is likewise coupled to terminal 38 through a resistor $R_{10}$. Collector $c_{10}$ is also coupled to the anode of diode $D_2$. Emitter $e_{10}$ is coupled to circuit ground through a resistor $R_{11}$ and to base $b_{11}$ of transistor $T_{11}$. Emitter $e_{11}$ is directly connected to circuit ground and collector $c_{11}$ is connected to the cathode of diode $D_2$ and through line 23 to the cathode of diode $D_1$ at circuit node 34. Note also that emitter $e_{1c}$ of transistor $T_1$ is connected to collector $c_{11}$ of transistor $T_{11}$ for reasons explained below.

A high applied to emitter $e_9$ will back-bias transistor $T_9$ and allow current to flow through its base-collector junction into base $b_{10}$ of transistor $T_{10}$ causing it to saturate. Consequently, current flowing out of emitter $e_{10}$ and into base $b_{11}$ will cause transistor $T_{11}$ to saturate and pull line 23 to within one $V_{ce(sat)}$ of ground. Alternatively, when emitter $e_9$ is pulled low, transistor $T_9$ will saturate and draw charge out of base $b_{10}$ causing transistor $T_{10}$ to turn OFF. As transistor $T_{10}$ turns OFF transistor $T_{11}$ is also turned OFF and line 23 is pulled up toward $V_{cc}$ through diode $D_2$ and resistor $R_{10}$.

In operation, with disable input terminal 30, i.e., emitter $e_9$ of transistor $T_9$ pulled down (a logic 0 applied to terminal 30), transistor $T_9$ becomes conductive and removes charge from base $b_{10}$ of transistor $T_{10}$ causing $T_{10}$ to turn OFF and, in turn, causing transistor $T_{11}$ to be turned OFF. With transistor $T_{11}$ nonconductive collector $c_{11}$ is pulled up to $V_{cc}$. Accordingly, node 34 is held at $V_{cc}$ and disable gate 18 has no operative effect upon buffer gate 12. Consequently, buffer stage 12 will energize lines 13 and 15 to cause switches 14 and 16 to be respectively turned ON and OFF, or OFF and ON in accordance with the state of the input signals applied to data input terminals 20 and 21.

By way of example a logic 1 applied to input terminal 20, while terminal 21 is high or at a logic 1, will turn OFF transistor $T_1$, which will in turn turn ON transistors $T_2$ and $T_3$, turn OFF transistor $T_5$, turn ON transistors $T_6$ and $T_7$ (to "source" output terminal 26) and turn OFF transistor $T_8$. On the other hand a logic 0 applied to input terminal 20 will turn ON transistor $T_1$, which in turn will turn OFF transistor $T_2$ and $T_3$, turn ON transistor $T_5$, turn OFF transistors $T_6$ and $T_7$ and turn ON transistor $T_8$ (to "sink" output terminal 26).

If now a logic 1 is applied to disable terminal 30, transistor $T_9$ will unsaturate and turn ON transistors $T_{10}$ and $T_{11}$ and thereby pull node 34 to within one $V_{ce(sat)}$ of ground. Accordingly, base $b_6$ is pulled to within one $V_{ce(sat)}$ and one diode ($D_1$) of ground turning transistors $T_6$ and $T_7$ OFF. Similarly, with node 34 pulled low, transistor $T_4$ is forward biased into saturation and conducts to pull base $b_5$ of transistor $T_5$ to within two $V_{ce(sat)}$ of ground, thus turning transistors $T_5$ and $T_8$ OFF. Note that switches 14 and 16 are thus disabled and held completely non-responsive to any input signals applied to terminals 20 and 21 so long as a logic 1 signal is applied to terminal 30.

In order to reduce the load on the circuits which drive the data input terminals, the emitter $e_{1c}$ of MET $T_1$ is also connected to line 23. Therefore, when the circuit is disabled it will not present a load at the data input terminals 20 and 21.

One of the problems encountered in the prior art which has discouraged the use of both active pull-up and active pull-down techniques in bus line connected logic circuits is the difficulty in maintaining the leakage current to source or sink sufficiently low over the operational temperature range (−55°C to +125°C) of the apparatus. The problem centers about the fact that the transfer characteristics of transistors typically shift with temperature so that, as indicated in FIG. 4 of the drawing, a substantially lower base-to-emitter voltage $V_{be}$ is required at the higher temperatures than at the lower temperatures in order to prevent the transistors from conducting. Note, in FIG. 4 for example, that whereas a transistor at 25°C can be kept well below some chosen specification, such as 40 microamps of leakage current, for example, by a $V_{be}$ of 0.6 volts, a $V_{be}$ of less than 0.42 volts is required to keep the leakage current below 40 microamps at 125°C. This, of course, means that in order to insure that the OFF leakages of switches 14 and 16 are held below some selected specification, the circuit must provide that in the high inpedance state, the inputs to the primary switching transistors must be held at the lowest possible OFF potentials. In the illustrated preferred embodiment, a logic 1 applied to disable input terminal 30 will hold the base of transistor $T_5$ at 2 $V_{ce(sat)}$ [$T_4$ and $T_{11}$] and the base of $T_6$ at 1 $V_{ce(sat)}$ [$T_{11}$] plug 1 diode [$D_1$].

Accordingly, with the OFF input to transistor $T_5$ at two $V_{ce(sat)}$ or less (approximately 0.6 volts) the input to transistor $T_8$ is extremely small and the leakage to sink will also meet the 40 microamp specification. Similarly, with the base of $T_6$ at a diode drop plus one $V_{ce(sat)}$ (of $T_{11}$) and the emitter $e_7$ at a $V_{ce(sat)}$ ($T_8$), the total available voltage across the base-emitter juntions of $T_6$ and $T_7$ is only one diode drop. Therefore the Darlington pair, $T_6$ and $T_7$ will not source more than the desired 40 $\mu$a.

Since the third logic state provided by the present invention isolates output terminal 26 by providing high impedances to both sourcing and sinking terminals 24 and 28, respectively, the number of such circuits which can be output onto a particular bus line in the manner illustrated in FIG. 4 of the drawing is limited only by the design parameters of the particular circuits utilized. For example, in the circuit illustrated, if the leakage currents through transistors $T_7$ and $T_8$ are to be held to less than 40 microamps over a given temperature range, then at least 128 of the circuits 40–167 can be output to a single bus-line 200. This is obviously a substantial improvement when compared to the relatively small number of logic circuits which can be coupled into a single data bus in accordance with the prior art.

Although the present invention has been disclosed in terms of a preferred embodiment utilizing NPN and bipolar transistors, and $T^2L$ switching circuits, it is to be understood that other transistor circuit elements and configurations can likewise be utilized to accomplish the desired ends achieved in accordance with the present invention. Accordingly, it is intended that the above description be taken as exemplary rather than limiting and that the appended claims be interpreted as covering all embodiments and subsequent modifications which fall within the true spirit and scope of my invention.

What is claimed is:

1. In a transistor logic circuit, first and second input signal receiving means and an output terminal, said output terminal being adapted to be connected to a driven logic circuit, first switching means connected to said first signal receiving input means and to said output terminal for selectively switching between first and second output level states on said output terminal in response to application of a signal to said first signal receiving input means, second switching means connected to said second signal receiving input means and to said first switching means to cause said first switching means to assume a condition in response to the application of a signal to said second signal receiving input means to provide a third output state on said output terminal, said third output state exhibiting a high impedance relative to the impedance of said first and second output level states, said first switching means including a control circuit node to which the output of said second switching means is to be applied, said second switching means being connected to said first switching means at said control circuit node, and a pair of diode junctions in said first switching means connected on opposite sides of said control circuit node and polarized for conduction toward said control circuit node.

2. The apparatus of claim 1 wherein one of said diode junctions is the base to emitter junction of a transistor.

3. The apparatus of claim 1 wherein said first switching means includes, first switching transistor means for selectively connecting said output terminal to a source of current at a first potential to establish said first output level state on said output terminal, second output terminal switching transistor means for selectively connecting said output terminal to a current sink at a second potential to establish said second output level state on said output terminal, an output buffer transistor means having a first output connected to control said first output terminal switching transistor means and a second output connected to control said second output terminal switching transistor means, and said output buffer transistor means also including a control input base terminal, and means for connecting said control input base terminal of said output buffer transistor to said control node via the intermediary of an emitter to collector connection of a second buffer transistor.

4. The apparatus of claim 1 wherein said first input signal receiving means includes an input receiving transistor means having a plurality of input receiving emitter terminals, and means for connecting the output of said second switching means to one of said emitter terminals of said input receiving transistor for isolating said input receiving transistor means from its source of first input receiving signals.

5. The apparatus of claim 4 wherein said first input signal receiving transistor means includes a multiple emitter transistor.

6. In a transistor logic circuit, first and second input signal receiving means and an output terminal, said output terminal being adapted to be connected to a driven logic circuit, first switching means connected to said first signal receiving input means and to said output terminal for selectively switching between first and second output level states on said output terminal in response to application of a signal to said first signal receiving input means, second switching means connected to said second signal receiving input means and to said first switching means to cause said first switching means to assume a condition in response to the application of a signal to said second signal receiving input means to provide a third output state on said output terminal, said third output state exhibiting a high impedance relative to the impedance of said first and second output level states, said first switching means including first output switching transistor means for selectively connecting said output terminal to a source of current at a first potential to establish said first output level state on said output terminal, second output terminal switching transistor means for selectively connecting said output terminal to a current sink at a second potential to establish said second output level state on said output terminal, and output buffer transistor means having a first output connected to control said first output terminal switching transistor means and a second output connected to control said second output terminal switching transistor means, said output buffer transistor means including a control input base terminal, and means for connecting said control input base terminal of said output buffer transistor to the output of said second switching means via the intermediary of an emitter to collector connection through a second buffer transistor.

7. The apparatus of claim 6 wherein said first input signal receiving means includes, an input receiving transistor means having a plurality of input receiving emitter terminals, and means for connecting the output of said second switching means to one of said emitter terminals to said input receiving transistor for isolating said input receiving transistor means from its source of first input receiving signals.

8. The apparatus of claim 7 wherein said first input signal receiving transistor means includes a multiple emitter transistor.

9. In a transistor logic circuit, first and second input signal receiving means and an output terminal, said output terminal being adapted to be connected to a driven logic circuit, first swtiching means connected to said first signal receiving input means and to said output terminal for selectively switching between first and second output level states on said output term-inal in response to application of a signal to said first signal receiving input means, second switching means connected to said second signal receiving input means and to said first switching means to cause said first switching means to assume a condition in response to the application of a signal to said second signal receiving means to provide a third output state on said output terminal, said third output state exhibiting a high impedance relative to the impedance of said first and second output level states, said first input signal receiving means including an input receiving transistor means having a plurality of input receiving emitter terminals, and means for connecting the output of said second switching means to one of said emitter terminals of said input receiving transistor means for isolating said input receiving transistor means from its source of first input receiving signals.

10. The apparatus of claim 9 wherein said first input signal transistor means includes a multiple emitter transistor.

* * * * *